(12) United States Patent
Nakagawa

(10) Patent No.: US 12,148,662 B2
(45) Date of Patent: Nov. 19, 2024

(54) SEMICONDUCTOR ELEMENT, SEMICONDUCTOR ELEMENT GROUP, AND METHOD OF MANUFACTURING SEMICONDUCTOR ELEMENT

(71) Applicant: ROHM CO., LTD., Kyoto (JP)

(72) Inventor: Satoshi Nakagawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 152 days.

(21) Appl. No.: 17/547,973

(22) Filed: Dec. 10, 2021

(65) Prior Publication Data

US 2022/0199466 A1 Jun. 23, 2022

(30) Foreign Application Priority Data

Dec. 21, 2020 (JP) ................. 2020-211309

(51) Int. Cl.
*H01L 23/544* (2006.01)
*H01L 21/67* (2006.01)
*H01L 21/768* (2006.01)

(52) U.S. Cl.
CPC .. *H01L 21/76892* (2013.01); *H01L 21/67259* (2013.01); *H01L 21/76885* (2013.01)

(58) Field of Classification Search
CPC ................................... H01L 23/544
See application file for complete search history.

(56) References Cited

U.S. PATENT DOCUMENTS

2018/0269091 A1* 9/2018 Ophir ............... H01L 21/67294

FOREIGN PATENT DOCUMENTS

| JP | H04111438 A | 4/1992 |
|---|---|---|
| JP | 2012209311 A | 10/2012 |
| JP | 2017-050394 A | 3/2017 |

OTHER PUBLICATIONS

Japanese Office Action dated Sep. 5, 2024, in the counterpart Japanese Patent Application No. 2020-211309.

* cited by examiner

*Primary Examiner* — Jae Lee
(74) *Attorney, Agent, or Firm* — Rabin & Berdo, P.C.

(57) ABSTRACT

A semiconductor element separated from an original substrate includes: an element substrate; and an element constitution part formed on the element substrate, wherein a pattern indicating a position of the semiconductor element before separating the semiconductor element from the original substrate is formed on at least one of the element substrate and the element constitution part.

9 Claims, 22 Drawing Sheets

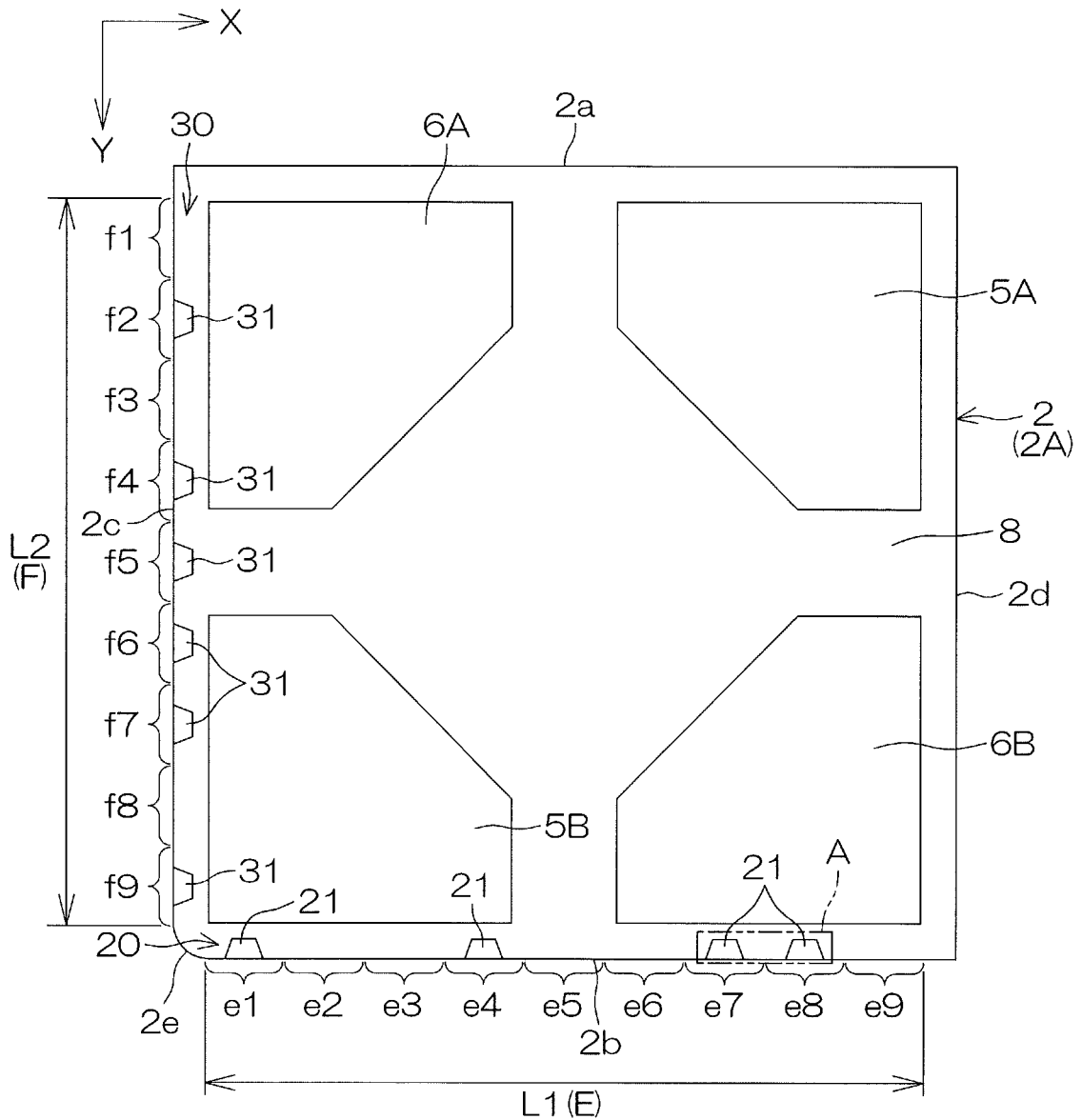

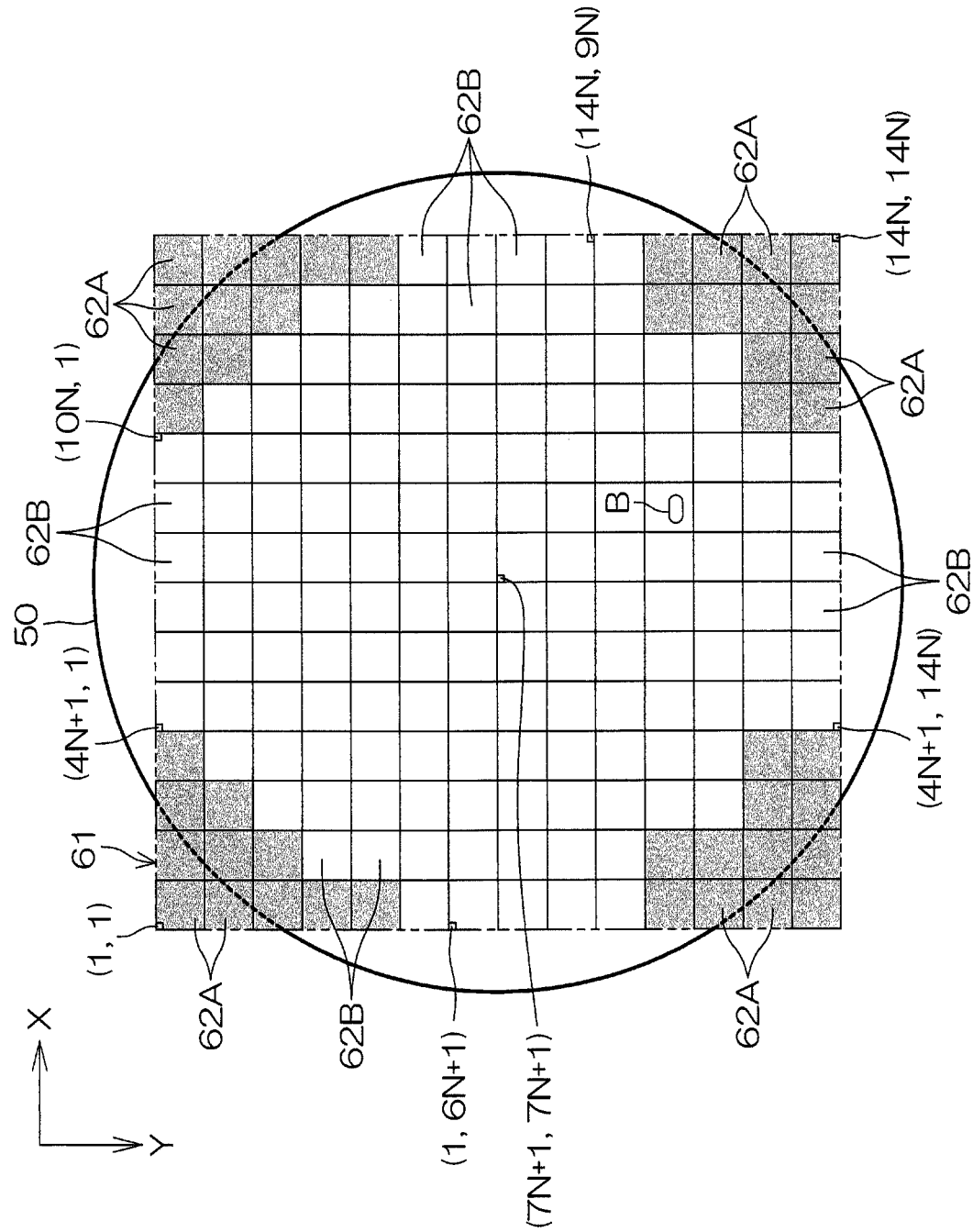

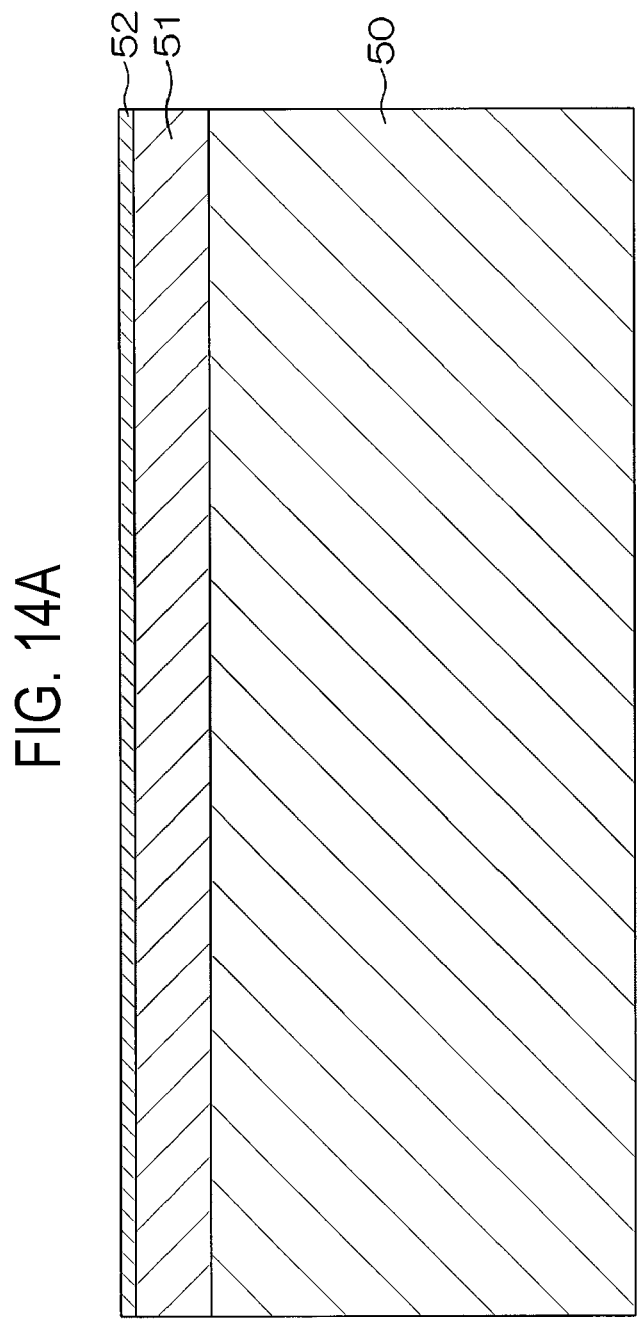

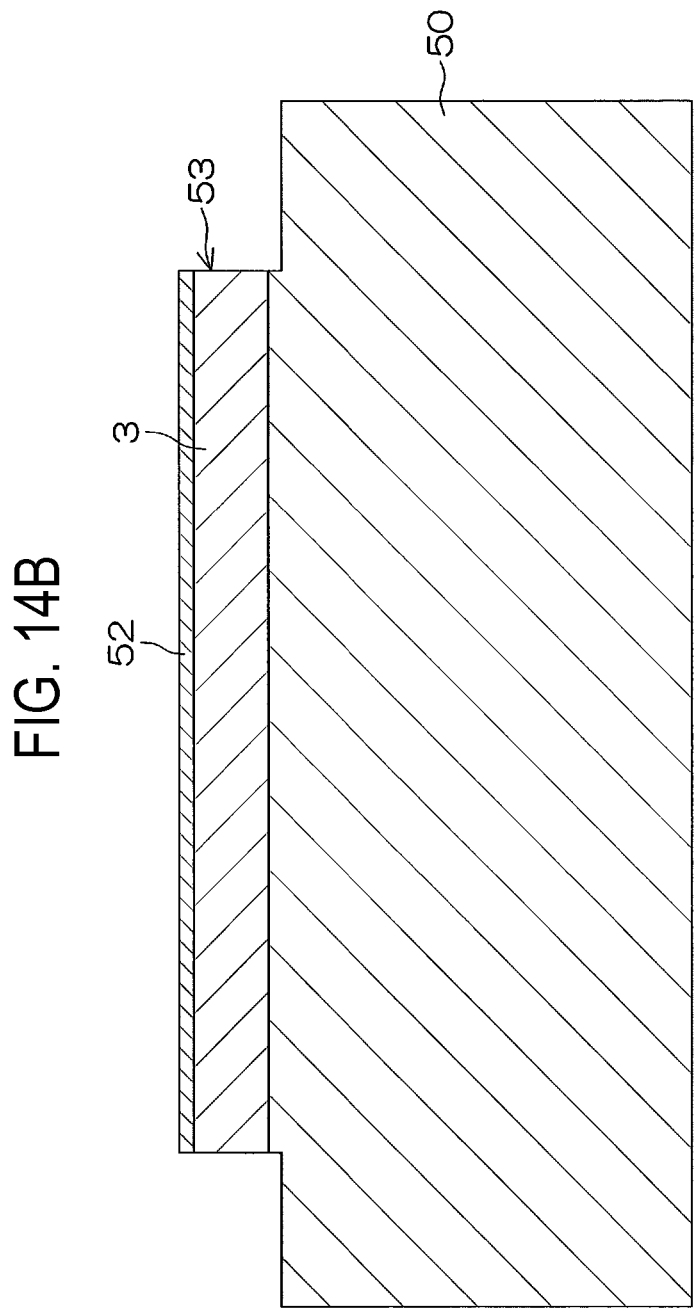

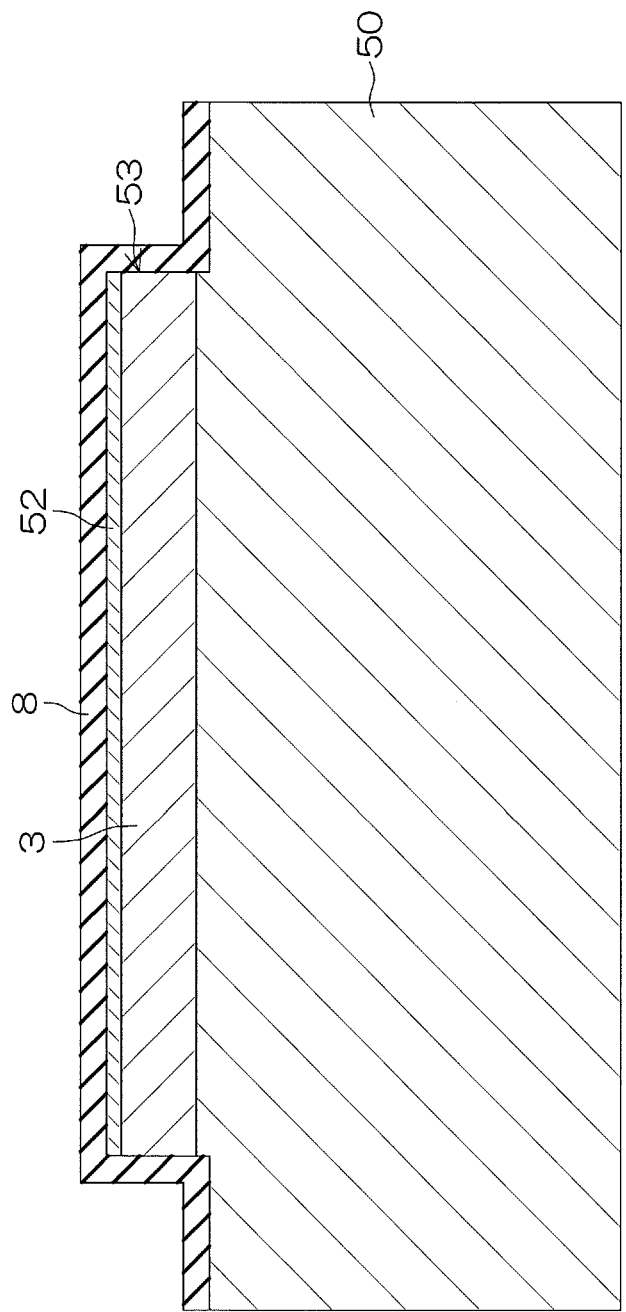

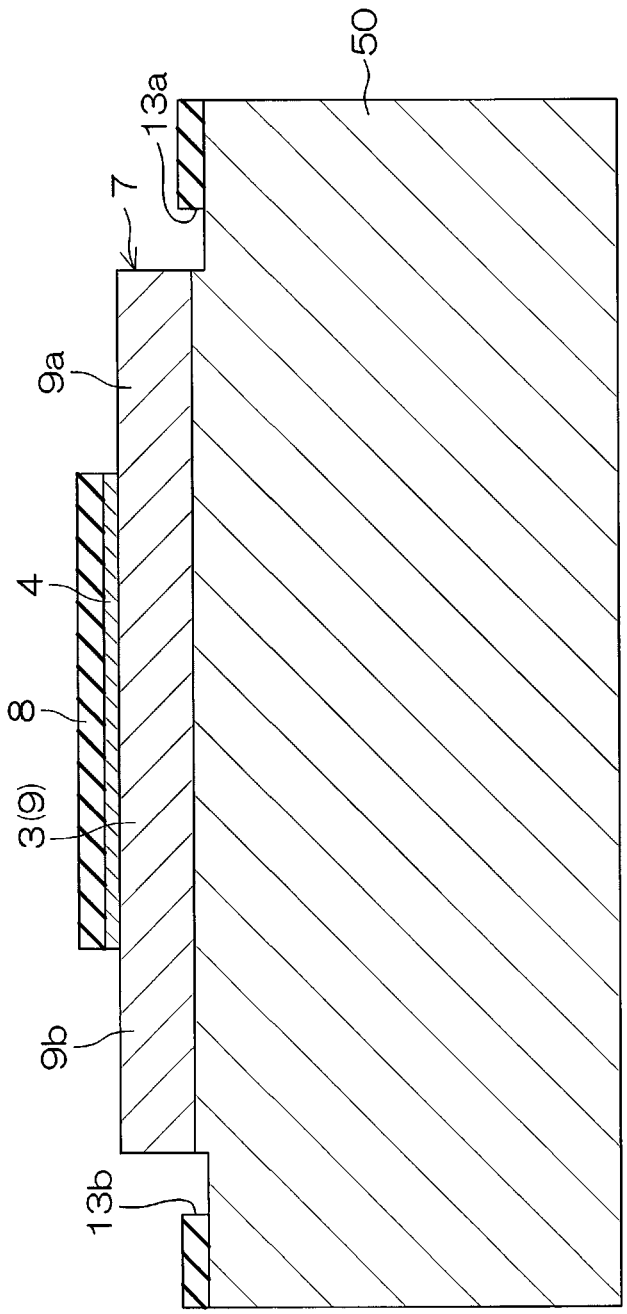

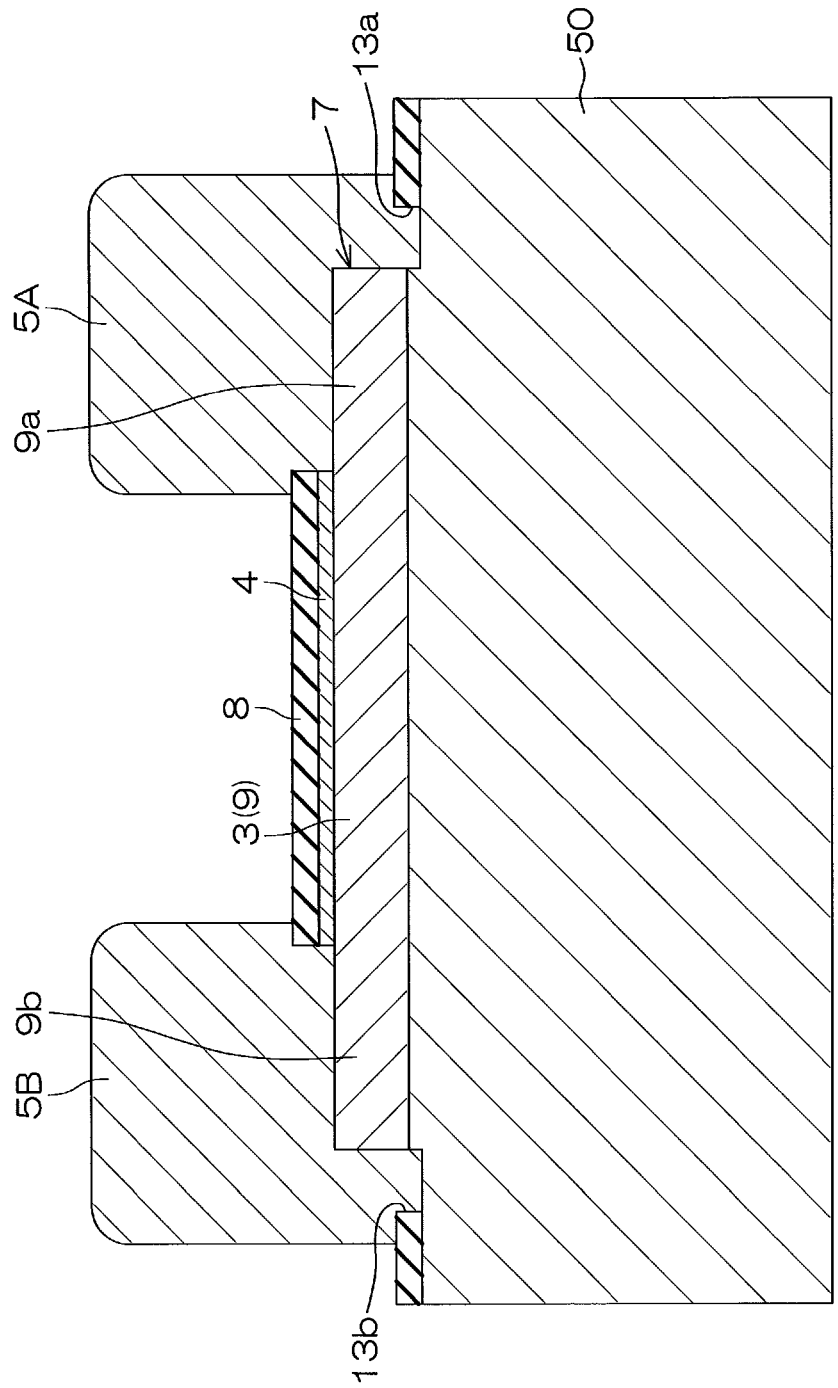

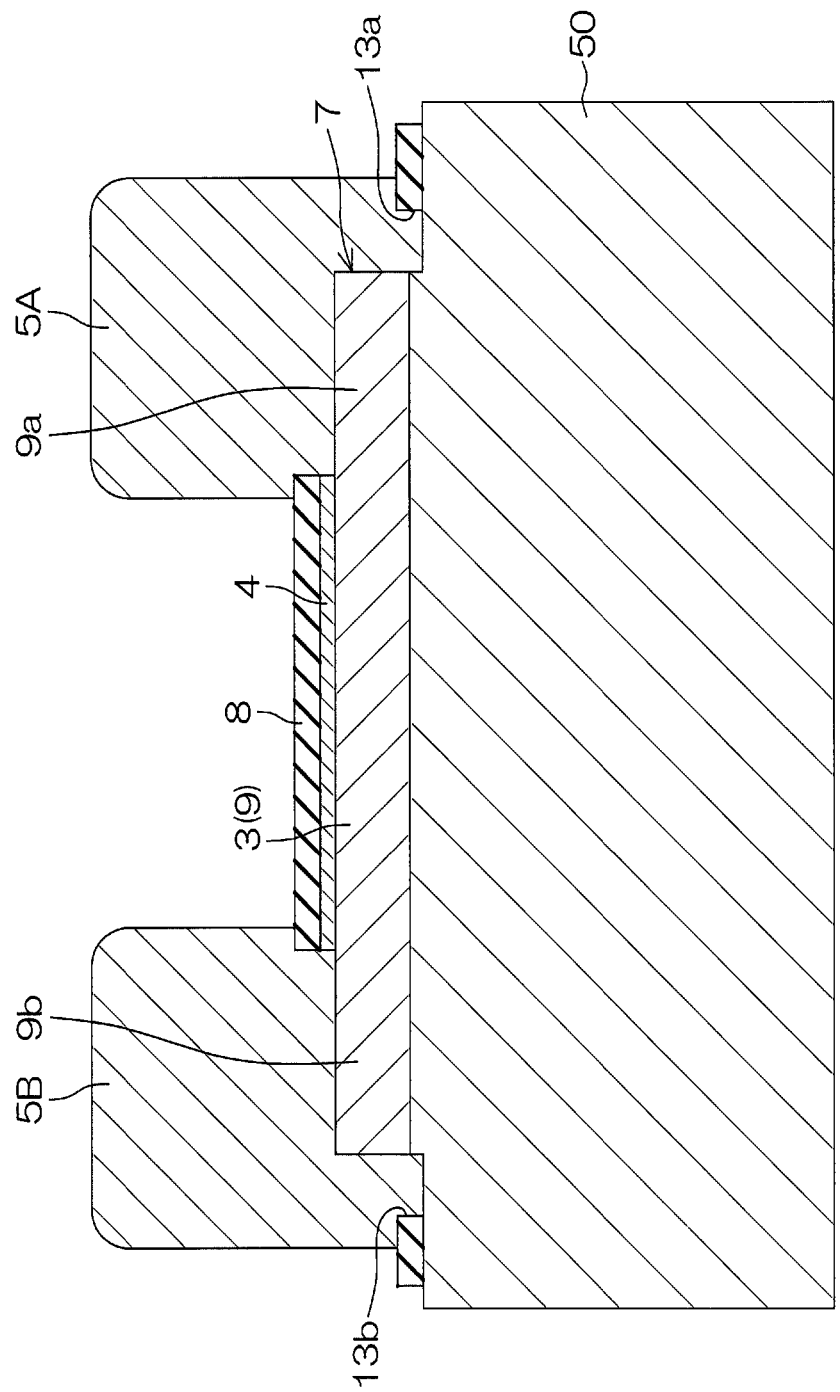

SEMICONDUCTOR ELEMENT, SEMICONDUCTOR ELEMENT GROUP, AND METHOD OF MANUFACTURING SEMICONDUCTOR ELEMENT

CROSS-REFERENCE TO RELATED APPLICATION

This application is based upon and claims the benefit of priority from Japanese Patent Application No. 2020-211309, filed on Dec. 21, 2020, the entire contents of which are incorporated herein by reference.

TECHNICAL FIELD

The present disclosure relates to a semiconductor element such as a magnetic-electric conversion element, a semiconductor element group, and a method of manufacturing the semiconductor element.

BACKGROUND

A Hall element is known as an example of a magnetic-electric conversion element. Since the Hall element can convert a magnetic signal into an electric signal, it is used in a wide range of fields such as a camera shake correction function, an autofocus function, and a pressure-sensitive sensor. In the related art, there is known a Hall element including a substrate and a magnetic-sensitive layer, which is formed on the substrate and has a cross shape in a plan view.

The Hall element is generally manufactured as follows. Specifically, a semiconductor wafer as an original substrate is prepared. A plurality of Hall element regions corresponding to a plurality of Hall elements is arranged and set in the form of a matrix on a surface of the semiconductor wafer. A boundary region (scribe line) is provided between adjacent Hall element regions. The boundary region is a strip-shaped region having a substantially constant width, and extends in two orthogonal directions to be formed in a grid pattern. The plurality of Hall elements is obtained by cutting the semiconductor wafer along the boundary region after performing necessary processes on the semiconductor wafer.

Traceability of information about Hall elements is required by end users of products that use the Hall elements. Specifically, position information (address information) of the Hall elements on a semiconductor wafer from which the Hall elements are cut out is required. However, when the Hall elements are small and 10,000 or more Hall elements, for example, are cut out from one semiconductor wafer, it is difficult to accurately recognize position information of the Hall elements on the semiconductor wafer from which the Hall elements are cut out.

SUMMARY

Some embodiments of the present disclosure provide a semiconductor element that allows accurate recognition of a position of the semiconductor element before separating the semiconductor element from an original substrate, a semiconductor element group, and a method of manufacturing the semiconductor element.

An aspect of the present disclosure provides a semiconductor element separated from an original substrate, the semiconductor element including: an element substrate; and an element constitution part formed on the element substrate, wherein a pattern indicating a position of the semiconductor element before separating the semiconductor element from the original substrate is formed on at least one of the element substrate and the element constitution part.

With this configuration, it is possible to accurately recognize the position of the semiconductor element before separating the semiconductor element from the original substrate (the position of the semiconductor element in the original substrate).

In some embodiments, the pattern may include a first pattern indicating a first coordinate value of the semiconductor element before separating the semiconductor element from the original substrate, and a second pattern indicating a second coordinate value of the semiconductor element before separating the semiconductor element from the original substrate.

In some embodiments, the first pattern may indicate the first coordinate value of the semiconductor element before separating the semiconductor element from the original substrate by a first binary number, and the second pattern may indicate the second coordinate value of the semiconductor element before separating the semiconductor element from the original substrate by a second binary number.

In some embodiments, the element constitution part may include a protective film, wherein the first pattern is configured to indicate the first coordinate value by the first binary number by using presence or absence of a cutout portion at each of a plurality of digit positions set in a first region of the protective film, and wherein the second pattern is configured to indicate the second coordinate value by the second binary number by using presence or absence of a cutout portion at each of a plurality of digit positions set in a second region, which is different from the first region, of the protective film.

In some embodiments, the element substrate may have a quadrangular shape in a plan view, wherein the protective film is formed on at least a peripheral edge portion of one surface of the element substrate, and has a first side and a second side, wherein the first region is set along the first side, and wherein the second region is set along the second side.

In some embodiments, the element substrate may have a quadrangular shape in a plan view, wherein the protective film includes at least four strip portions extending inward from a central portion of each side of the element substrate in a plan view, wherein the first region is set in two of the four strip portions extending from the central portion of a pair of sides of the element substrate that face each other in a plan view, and wherein the second region is set in the remaining two strip portions.

In some embodiments, the cutout portions may have a trapezoidal shape, a square shape, a rectangular shape, a triangular shape, or a circular shape in a plan view.

In some embodiments, the element constitution part may be a magnetic-electric conversion element.

In some embodiments, the element constitution part may include: a magnetic-sensitive layer formed on the element substrate; and a pair of input terminals and a pair of output terminals, which are electrically connected to the magnetic-sensitive layer, wherein the magnetic-sensitive layer includes an input side region extending in one direction and an output side region extending in a direction intersecting the input side region in a plan view, wherein the output side region includes a first output side region protruding from one side of the input side region and a second output side region protruding from the other side of the input side region, and wherein the protective film is formed so as to cover the element substrate and the magnetic-sensitive layer in a plan view, and has a pair of input side contact openings in which parts of the pair of input terminals, respectively, are buried and a pair of output side contact openings in which parts of the pair of output terminals, respectively, are buried.

An aspect of the present disclosure provides a semiconductor element group separated from a plurality of element regions of an original substrate, the semiconductor element group including a plurality of semiconductor elements, wherein each of the plurality of semiconductor elements includes: an element substrate separated from the original substrate; and an element constitution part formed on the element substrate, and wherein a pattern indicating a position of a corresponding one of the plurality of semiconductor elements before separating the plurality of semiconductor elements from the original substrate is formed on at least one of the element substrate and the element constitution part of the each of the plurality of semiconductor elements.

With this configuration, it is possible to obtain a semiconductor element group that allows accurate recognition of the position of the semiconductor element before separating the semiconductor element from the original substrate.

An aspect of the present disclosure provides a method of manufacturing a semiconductor element, the method including: forming a plurality of semiconductor elements, each of which includes an element substrate and an element constitution part, on an original substrate by forming the element constitution part in each of a plurality of element regions of the original substrate; forming a pattern indicating a position of a corresponding one of the plurality of semiconductor elements in the original substrate on at least one of the element substrate and the element constitution part of each of the plurality of semiconductor elements; and obtaining the plurality of semiconductor elements by separating the plurality of element regions of the original substrate.

With this manufacturing method, it is possible to manufacture a semiconductor element that allows accurate recognition of the position of the semiconductor element before separating the semiconductor element from the original substrate.

In some embodiments, the pattern may include a first pattern indicating a first coordinate value of the corresponding one of the plurality of semiconductor elements in the original substrate, and a second pattern indicating a second coordinate value of the corresponding one of the plurality of semiconductor elements in the original substrate.

In some embodiments, the first pattern may indicate the first coordinate value of the corresponding one of the plurality of semiconductor elements in the original substrate by a first binary number, and the second pattern may indicate the second coordinate value of the corresponding one of the plurality of semiconductor elements in the original substrate by a second binary number.

In some embodiments, the element constitution part may be a magnetic conversion element, and the act of forming the plurality of semiconductor elements on the original substrate may include: forming a first compound semiconductor layer, which is an origin of a magnetic-sensitive layer, and a second compound semiconductor layer, which is an origin of a cap layer, in this order on the original substrate; patterning the first compound semiconductor layer and the second compound semiconductor layer to form the magnetic-sensitive layer and the cap layer disposed on the magnetic-sensitive layer for each of the element regions, the magnetic-sensitive layer having a cross shape in a plan view and having an input side region extending in one direction and an output side region extending in a direction intersecting the input side region; forming a protective film; forming a pair of input side contact openings exposing both end portions of the input side region and a pair of output side contact openings exposing both end portions of the output side region on the protective film; and burying a pair of input terminals in contact with the input side region in the pair of input side contact openings and burying a pair of output terminals in contact with the output side region in the pair of output side contact openings.

In some embodiments, the act of forming the pattern may include forming, for each of the plurality of element regions, the first pattern in a first region of the protective film and the second pattern in a second region, which is different from the first region, of the protective film, wherein the first pattern is configured to indicate the first coordinate value by the first binary number by using presence or absence of a cutout portion at each of a plurality of digit positions set in the first region, and wherein the second pattern is configured to indicate the second coordinate value by the second binary number by using presence or absence of a cutout portion at each of a plurality of digit positions set in the second region.

BRIEF DESCRIPTION OF DRAWINGS

The accompanying drawings, which are incorporated in and constitute a part of the specification, illustrate embodiments of the present disclosure.

FIG. 5A is a plan view for explaining a first pattern and a second pattern.

FIG. 6A is a plan view showing an original substrate.

FIG. 14A is a cross-sectional view showing a process in a method of manufacturing the Hall element shown in FIG. 1.

FIG. 14B is a cross-sectional view showing a subsequent process of FIG. 14A.

FIG. 14C is a cross-sectional view showing a subsequent process of FIG. 14B.

FIG. 14D is a cross-sectional view showing a subsequent process of FIG. 14C.

FIG. 14E is a cross-sectional view showing a subsequent process of FIG. 14D.

FIG. 14F is a cross-sectional view showing a subsequent process of FIG. 14E.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
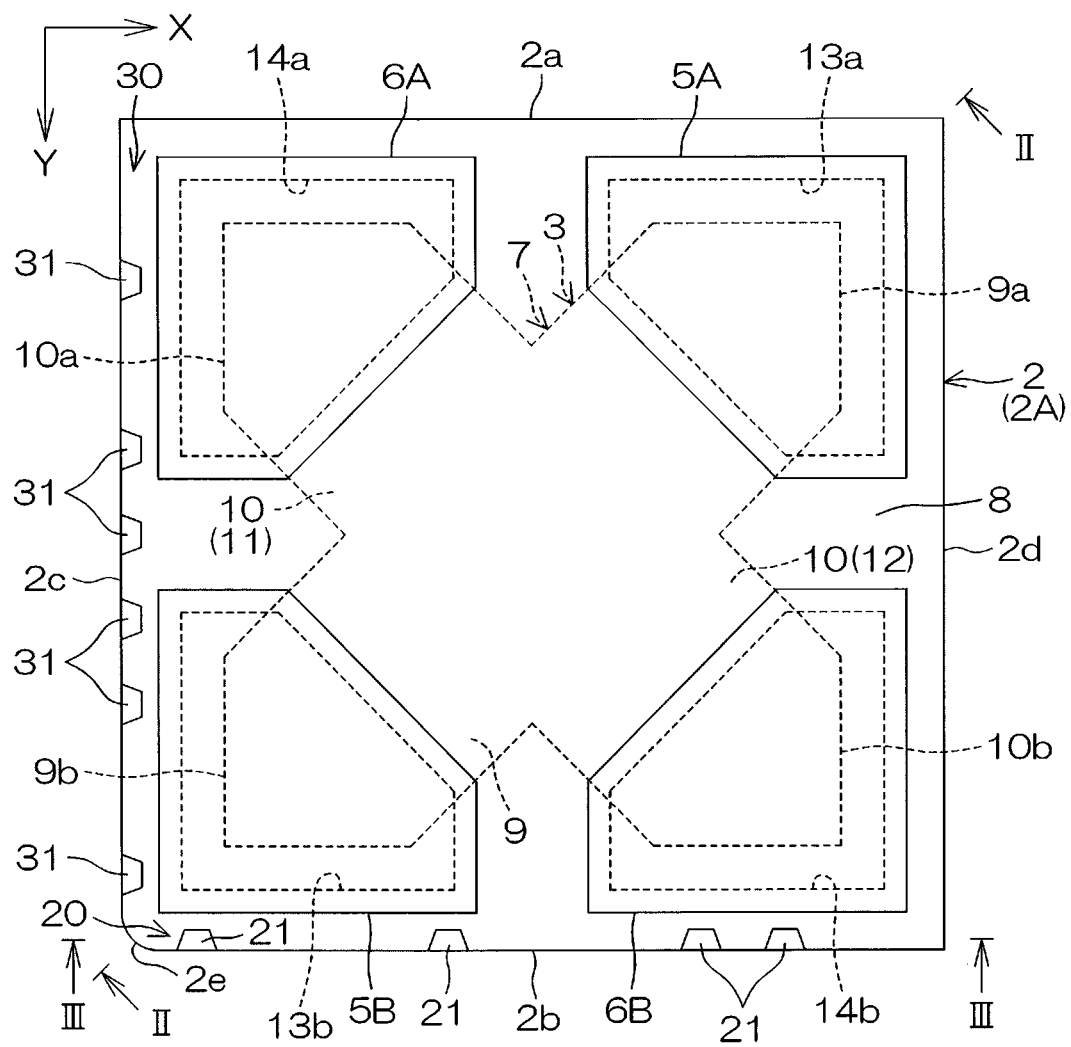
FIG. 1 is a plan view of a Hall element as an example of a semiconductor element according to an embodiment of the present disclosure.
Figure 2:
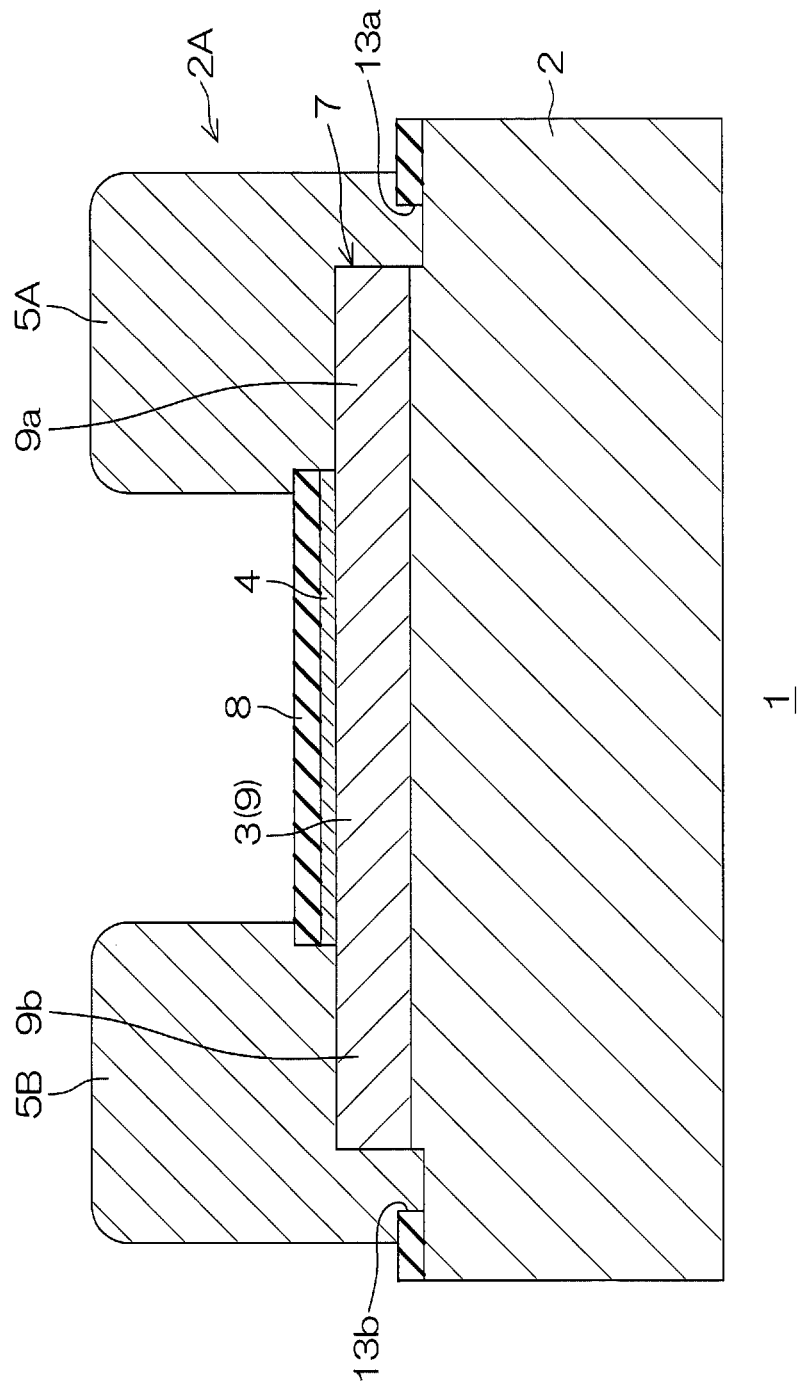
FIG. 2 is a cross-sectional view taken along line II-II of FIG. 1.
Figure 3:
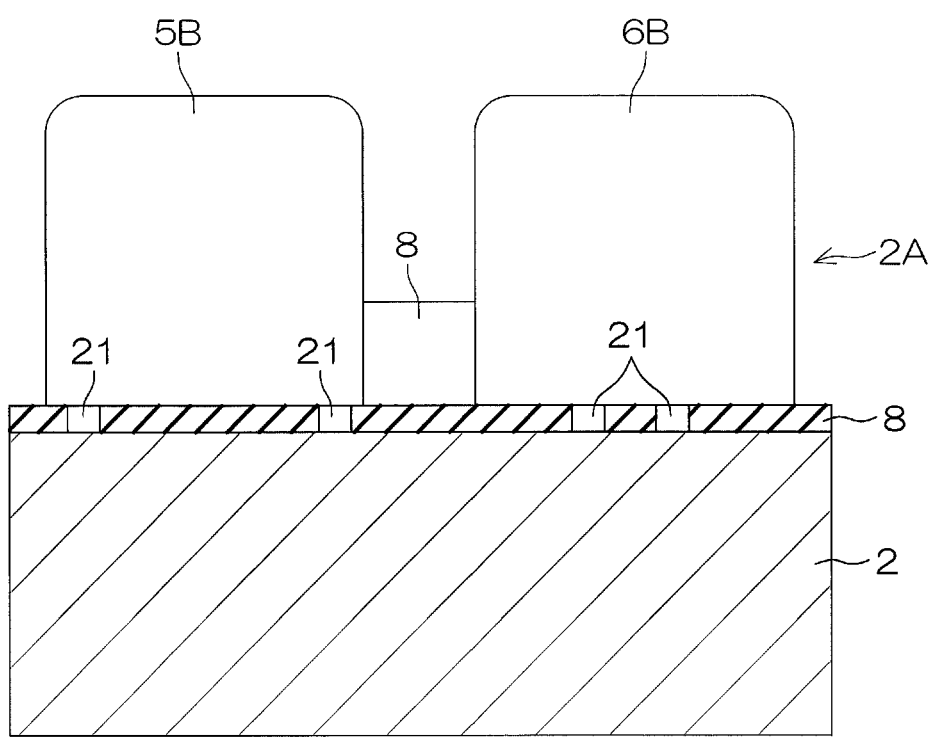
FIG. 3 is a cross-sectional view taken along line III-III of FIG. 1.
Figure 4:
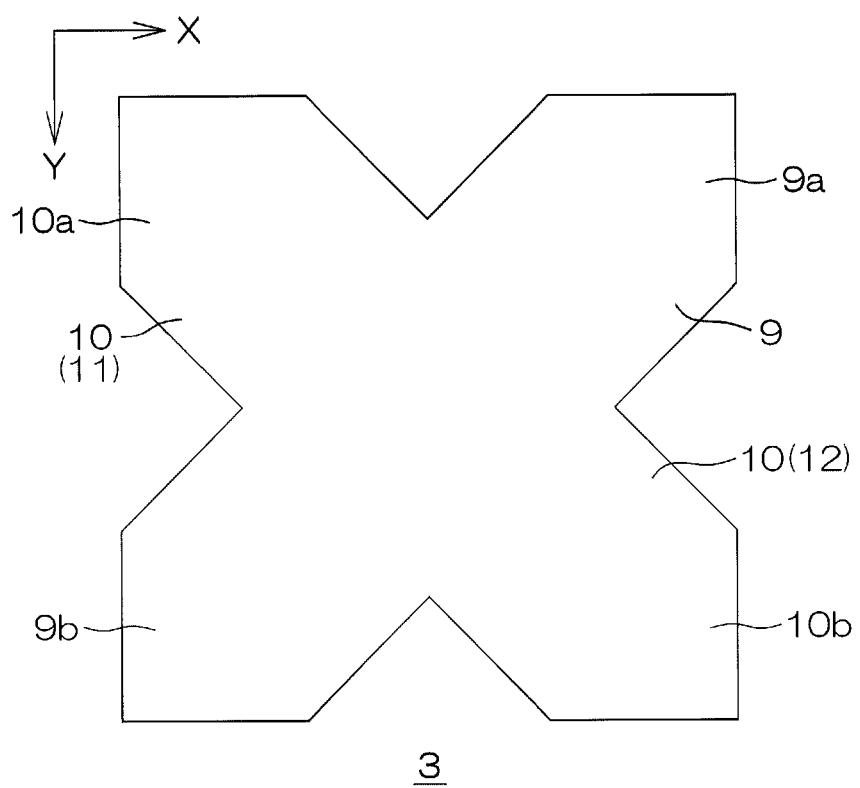
FIG. 4 is a plan view showing a magnetic-sensitive layer of FIG. 1.
Figure 5B:
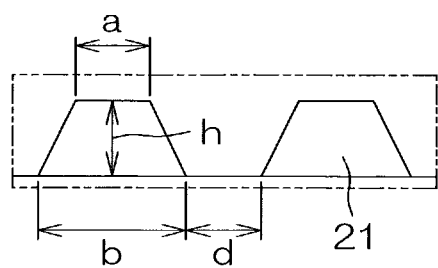
FIG. 5B is a partially enlarged plan view of a region A of FIG. 5A.

An embodiment in which the present disclosure is applied to a Hall element as an example of a semiconductor element will be now described in detail with reference to the accompanying drawings. FIG. 1 is a plan view of a Hall element 1 as an example of a semiconductor element according to an embodiment of the present disclosure. FIG. 2 is a cross-sectional view taken along line II-II of FIG. 1. FIG. 3 is a cross-sectional view taken along line III-III of FIG. 1. FIG. 4 is a plan view showing a magnetic-sensitive layer 3 of FIG. 1. FIG. 5A is a plan view for explaining a first pattern 20 and a second pattern 30 of FIG. 1. FIG. 5B is a partially enlarged plan view of a region A of FIG. 5A.

The Hall element 1 includes an element substrate (hereinafter abbreviated as a substrate) 2 and an element constitution part 2A formed on the substrate 2. The element constitution part 2A includes the magnetic-sensitive layer 3, a cap layer 4 formed on the magnetic-sensitive layer 3, and a pair of input terminals 5A and 5B and a pair of output terminals 6A and 6B which are electrically connected to the magnetic-sensitive layer 3. In the present embodiment, the Hall element 1 has a mesa structure 7 in which a portion of the substrate 2, the magnetic-sensitive layer 3, and the cap layer 4 form a cross shape in a plan view. The Hall element 1 has a protective film 8 that covers an exposed surface of the substrate 2, an exposed surface of the magnetic-sensitive layer 3, and an exposed surface of the cap layer 4.

The substrate 2 is formed in substantially a rectangular parallelepiped shape, and has substantially a square main surface having two sides 2a and 2b parallel to an X direction and two sides 2c and 2d parallel to a Y direction in a plan view. The length of one side of the main surface is about 160 μm. As the substrate 2, a Si substrate, a SiC substrate, a sapphire single crystal substrate, a compound semiconductor substrate, a semi-insulating substrate having a relatively large resistance value, or the like can be adopted. When the substrate 2 is a compound semiconductor substrate, the substrate 2 may contain InSb, InAs, or GaAs. In the present embodiment, the substrate 2 includes a semi-insulating compound semiconductor substrate containing GaAs.

Among four corner portions of the substrate 2, a corner portion where the sides 2b and 2c of the main surface intersect is formed on a curved surface 2e protruding outward in a plan view. By this curved surface 2e, each of the sides 2a to 2d of the main surface can be specified. The magnetic-sensitive layer 3 contains a compound semiconductor doped with n-type impurities. The magnetic-sensitive layer 3 may contain InSb, InAs, or GaAs as a compound semiconductor. The magnetic-sensitive layer 3 may contain Si as n-type impurities. In the present embodiment, the magnetic-sensitive layer 3 contains GaAs. The thickness of the magnetic-sensitive layer 3 may be, for example, 2,000 angstroms or more and 15,000 angstroms or less.

Referring to FIGS. 1 and 4, the magnetic-sensitive layer 3 includes an input side region 9 extending in one direction and an output side region 10 extending in a direction intersecting the input side region 9 (a direction intersecting in a cross shape) in a plan view. In the present embodiment, the input side region 9 is provided so as to extend along one diagonal line of the substrate 2 in a plan view and has both end portions 9a and 9b having a triangular shape in a plan view. On the other hand, the output side region 10 is provided so as to extend along the other diagonal line of the substrate 2 in a plan view and has both end portions 10a and 10b having a triangular shape in a plan view. The output side region 10 includes a first output side region 11 protruding from one side of the input side region 9 and a second output side region 12 protruding from the other side of the input side region 9. In the present embodiment, the width of the output side region 10 is substantially equal to the width of the input side region 9 in a plan view.

More specifically, at a central portion of the input side region 9 in a longitudinal direction thereof, the first output side region 11 protrudes from one side surface of the input side region 9 along the longitudinal direction in a direction orthogonal to the longitudinal direction, and includes one end portion 10a. At the central portion of the input side region 9 in the longitudinal direction, the second output side region 12 protrudes from the other side surface of the input side region 9 along the longitudinal direction in the direction orthogonal to the longitudinal direction, and includes the other end portion 10b. The first output side region 11 and the second output side region 12 protrude from the input side region 9 with substantially the same amount of protrusion.

The cap layer 4 is formed in a shape consistent with a central region of a cross shape in a plan view, which is obtained by excluding the end portions 9a, 9b, 10a, and 10b and regions in the vicinity of the end portions 9a, 9b, 10a, and 10b from the surface of the magnetic-sensitive layer 3, and contains, for example, a compound semiconductor doped without impurities. The cap layer 4 may contain InSb, InAs, or GaAs as a compound semiconductor. In the present embodiment, the cap layer 4 contains GaAs. The thickness of the cap layer 4 may be, for example, about 500 angstroms.

The protective film 8 is, for example, a nitride film containing SiN. The protective film 8 is formed with a pair of input side contact openings 13a and 13b that expose both end portions 9a and 9b of the input side region 9 and regions in the vicinity of the end portions 9a and 9b on the surface of the substrate 2. Further, the protective film 8 is formed with a pair of output side contact openings 14a and 14b that expose both end portions 10a and 10b of the output side region 10 and regions in the vicinity of the end portions 10a and 10b on the surface of the substrate 2. The cap layer 4 is not formed in inner regions of the input side contact openings 13a and 13b and inner regions of the output side contact openings 14a and 14b of the surface of the magnetic-sensitive layer 3.

The pair of input terminals 5A and 5B is buried in the pair of input side contact openings 13a and 13b, respectively, and the pair of output terminals 6A and 6B is buried in the pair of output side contact openings 14a and 14b, respectively. The pair of input terminals 5A and 5B forms an ohmic contact with the input side region 9 in the pair of input side contact openings 13a and 13b, respectively. On the other hand, the pair of output terminals 6A and 6B forms an ohmic contact with the output side region 10 in the pair of output side contact openings 14a and 14b, respectively.

The pair of input terminals 5A and 5B and the pair of output terminals 6A and 6B may be formed of one metal film or may be formed of a stacked film in which a plurality of metal films is stacked. In some embodiments, the pair of input terminals 5A and 5B and the pair of output terminals 6A and 6B may include at least an Au film. The Hall element 1 is obtained by being separated from the original substrate. Specifically, the Hall element 1 is obtained by performing necessary processes on the original substrate (semiconductor wafer) in which a plurality of element regions is arranged in the form of a matrix and then separating each element region from the original substrate. The Hall element 1 is formed with the patterns 20 and 30 indicating a position of the Hall element 1 before separating the Hall element 1 from the original substrate. Details of the patterns 20 and 30 will be described later.

Figure 6B:
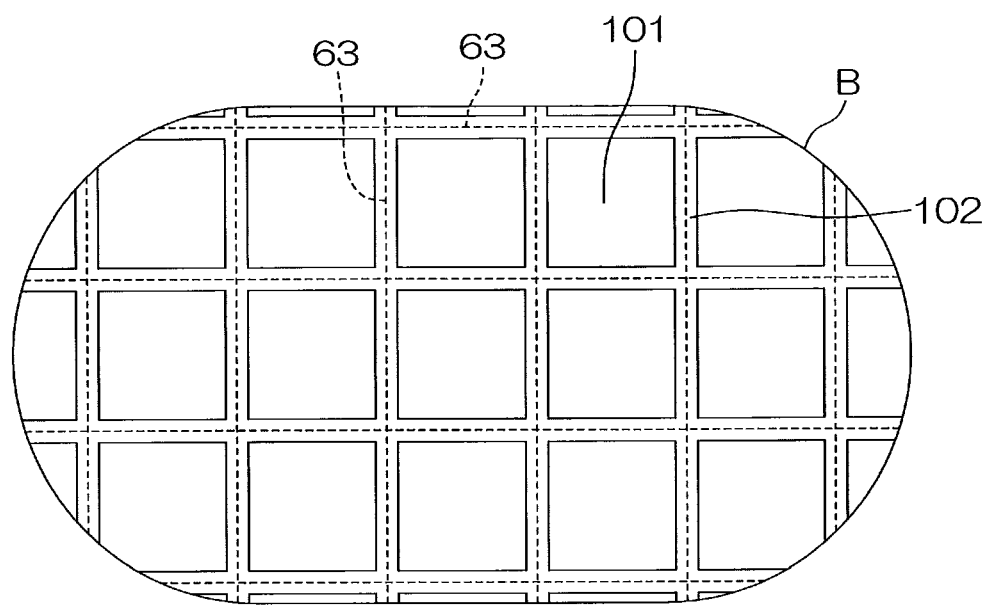
FIG. 6B is a partially enlarged plan view of a region B of FIG. 6A.

FIG. 6A is a plan view showing an original substrate 50 of the substrate 2. FIG. 6B is a partially enlarged plan view of a region B of FIG. 6A. A plurality of Hall element regions (functional element forming regions) 101 (see FIG. 6B) corresponding to a plurality of Hall elements 1 is arranged and set in the form of a matrix on the surface of the original substrate 50. A boundary region (scribe line) 102 is provided between adjacent Hall element regions 101. The boundary region is a strip-shaped region having substantially a constant width, and extends in directions orthogonal to each other to be formed in a grid pattern. The plurality of Hall elements 1 is obtained by performing necessary processes on the original substrate 50 and then cutting the original substrate 50 along the boundary region 102.

A first quadrangular region 61 having a square shape shown by a two-dot chain line in FIG. 6A is an imaginary quadrangular region preset for the original substrate 50. The first quadrangular region 61 has two sides parallel to the X direction and two sides parallel to the Y direction, as shown in FIG. 6A. The X and Y directions in FIG. 6A correspond to the X and Y directions, respectively, in FIG. 1. By being divided into fourteen sections in the X direction and the Y direction, respectively, the first quadrangular region 61 is divided into 196 second quadrangular regions 62A and 62B having a square shape. By being divided into N sections (N is an integer of two or more) in the X direction and the Y direction, respectively, each of the second quadrangular regions 62A and 62B is divided into N×N third quadrangular regions 63 (square regions surrounded by a broken line in FIG. 6B) having a square shape.

Among the second quadrangular regions 62A and 62B, the second quadrangular regions 62A colored in gray in the vicinity of the four corner portions are second quadrangular regions 62A in which no Hall element 1 is formed. Among the second quadrangular regions 62A and 62B, the second quadrangular regions 62B not colored in gray are second quadrangular regions 62B in which a plurality of Hall elements 1 is formed. As shown in FIG. 6B, the Hall element region (functional element forming region) 101 is formed for each of the third quadrangular regions 63 in the second quadrangular regions 62B.

Position information represented by the X coordinate and the Y coordinate is assigned to each of the third quadrangular regions 63 (including the third quadrangular regions 63 in the second quadrangular regions 62A and the third quadrangular regions 63 in the second quadrangular regions 62B). In the present embodiment, the position information of (1, 1) to (14N, 14N) is assigned to each of the third quadrangular regions 63. The position information of (1, 1) is assigned to the third quadrangular region 63 closest to the upper left corner portion of the first quadrangular region 61 of FIG. 6A. The position information of (14N, 14N) is assigned to the third quadrangular region 63 closest to the lower right corner portion of the first quadrangular region 61 of FIG. 6A.

For each Hall element region 101 in the second quadrangular regions 62B, position information assigned to a third quadrangular region 63 surrounding the Hall element region 101 is assigned. As a result, for each Hall element region 101, position information according to a position of the Hall element region 101 in the original substrate 50 is assigned. In other words, for each of the Hall elements 1 respectively corresponding to the Hall element regions 101, position information according to a position of the Hall element 1 in the original substrate 50 is assigned.

Referring to FIGS. 1, 3, 5A, and 5B, in the present embodiment, the first pattern 20 indicating an X coordinate value of the Hall element 1 in the original substrate 50 is formed in a lengthwise middle region (hereinafter referred to as a "first region E") of an edge portion of the protective film 8 along the side 2b of the substrate 2. The second pattern 30 indicating a Y coordinate value of the Hall element 1 in the original substrate 50 is formed in a lengthwise middle region (hereinafter referred to as a "second region F") of an edge portion of the protective film 8 along the side 2c of the substrate 2.

The X coordinate value is an example of a first coordinate value of the present disclosure, and the Y coordinate value is an example of the second coordinate value of the present disclosure. In the present embodiment, the first pattern 20 is a pattern that indicates the X coordinate value of the Hall element 1 in the original substrate 50 by a 9-digit binary number. Specifically, the first pattern 20 is configured to indicate the X coordinate value by a binary number by using the presence or absence of a cutout portion 21 at each of a plurality of digit positions e1 to e9 set in the first region E of the protective film 8.

Among the digit positions e1 to e9, the leftmost digit position e1 is the most significant digit position, and the rightmost digit position e9 is the least significant digit position. For each of the digit positions e1 to e9, a value of a corresponding digit becomes "1" when the cutout portion 21 is formed, and the value of the corresponding digit becomes "0" when the cutout portion 21 is not formed. In the present embodiment, the second pattern 30 is a pattern that indicates the Y coordinate value of the Hall element 1 in the original substrate 50 by a 9-digit binary number. Specifically, the second pattern 30 is configured to indicate the Y coordinate value by a binary number by using the presence or absence of a cutout portion 31 at each of a plurality of digit positions f1 to f9 set in the second region F of the protective film 8.

Among the digit positions f1 to f9, the uppermost digit position f1 is the most significant digit position, and the lowermost digit position f9 is the least significant digit position. For each of the digit positions f1 to f9, a value of a corresponding digit becomes "1" when the cutout portion 31 is formed, and the value of the corresponding digit becomes "0" when the cutout portion 31 is not formed. The cutout portions 21 and 31 are portions where the protective film 8 is cut out. In the present embodiment, the cutout portion 21 is an isosceles trapezoidal notch in which a lower base and an upper base are parallel to the side 2b and the upper base is located on a side of the side 2a with respect to the lower base in a plan view. The cutout portion 31 is an isosceles trapezoidal notch in which a lower base and an upper base are parallel to the side 2c and the upper base is located on a side of the side 2d with respect to the lower base in a plan view.

The cutout portions 21 and 31 have an upper base length a of about 5 μm, a lower base length b of about 10 μm, and a height h of about 5 μm. A distance d between adjacent cutout portions 21 and between adjacent cutout portions 31 is about 5 μm. A length L1 of the first region E and a length L2 of the second region F are about 135 μm. A width of the first region E and the second region F is about 10 μm. As described above, the length of one side of the main surface of the substrate 2 is about 160 μm.

In the examples of FIGS. 1, 3, 5A, and 5B, in the first region E, the cutout portion 21 is formed at each of the digit positions e1, e4, e7, and e8, and the cutout portion 21 is not formed at each of the digit positions e2, e3, e5, e6, and e9. That is, the first pattern 20 is a pattern indicating a binary number "100100110" (294 in decimal number). Further, in the second region F, the cutout portion 31 is formed at each of the digit positions f2, f4, f5, f6, f7, and f9, and the cutout portion 31 is not formed at each of the digit positions f1, f3, and f8. That is, the second pattern 30 is a pattern indicating a binary number "010111101" (189 in decimal number). That is, the patterns 20 and 30 shown in FIGS. 1, 3, 5A, and 5B show patterns of the Hall element 1 having position information (X, Y) of (294, 189).

Figure 7:
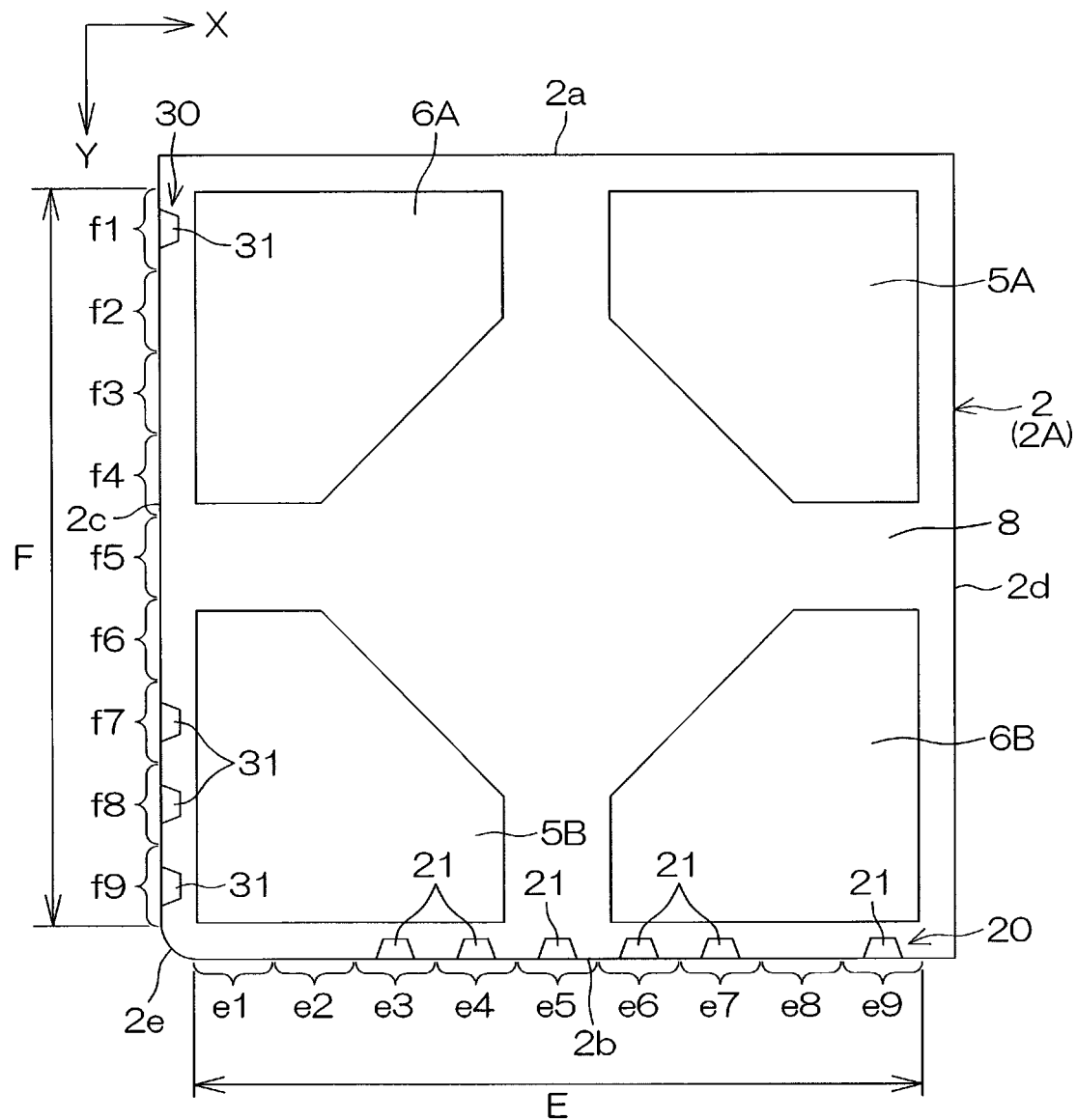
FIG. 7 is a plan view showing a first pattern and a second pattern of a Hall element having position information (X, Y) of (125, 263).

FIG. 7 is a plan view showing the first pattern 20 and the second pattern 30 of the Hall element 1 having position information (X, Y) of (125, 263). In this case, in the first region E, the cutout portion 21 is formed at each of the digit positions e3, e4, e5, e6, e7, and e9, and the cutout portion 21 is not formed at each of the digit positions e1, e2, and e8. That is, the first pattern 20 is a pattern indicating a binary number "1111101" (125 in decimal number). Further, in the second region F, the cutout portion 31 is formed at each of the digit positions f1, f7, f8, and f9, and the cutout portion 31 is not formed at each of the digit positions f2 to f6. That is, the second pattern 30 is a pattern indicating a binary number "1000001111" (263 in decimal number).

Figure 8:
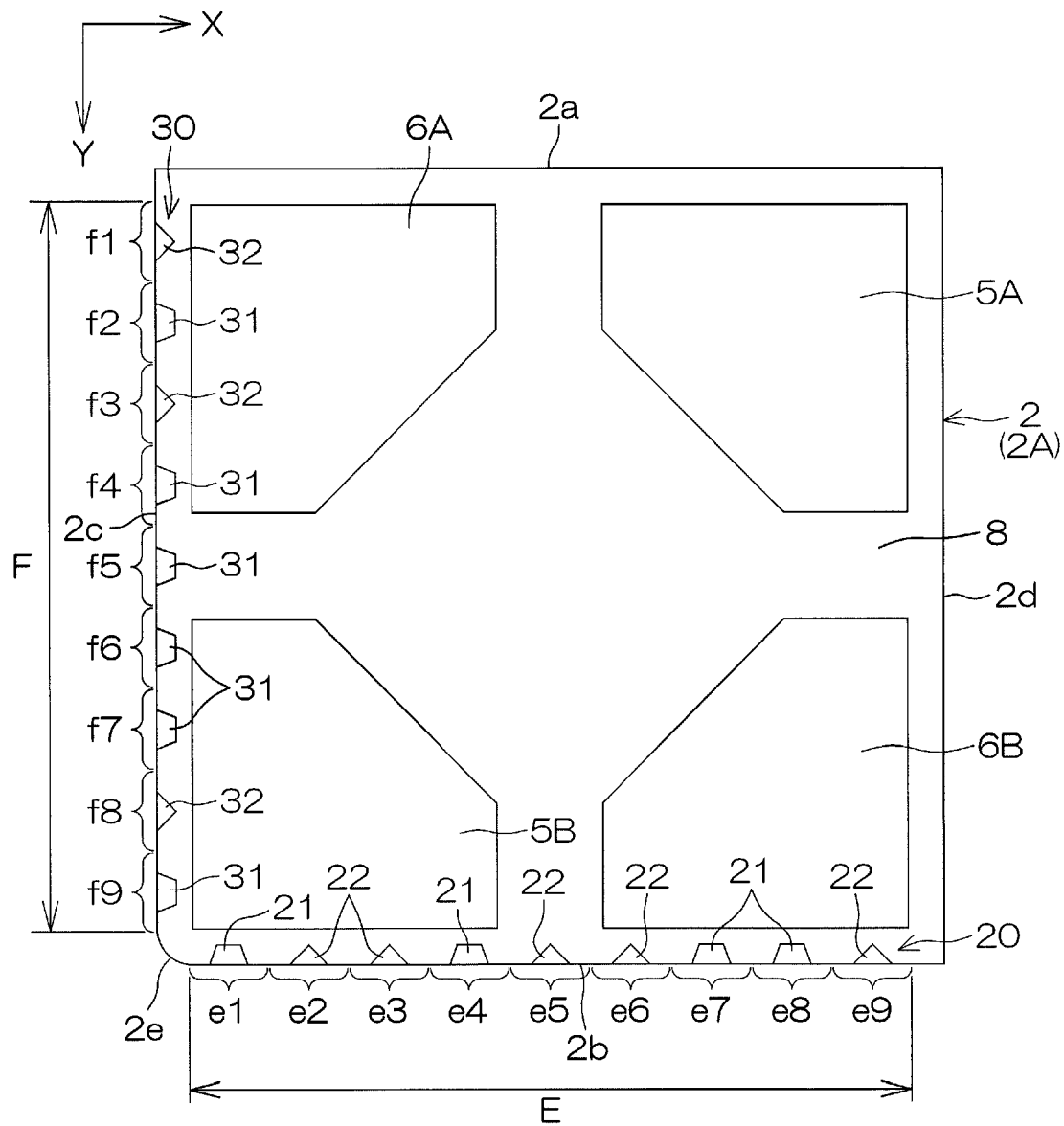
FIG. 8 is a plan view showing a modification of the first pattern and the second pattern.

Assuming that the cutout portions 21 and 31 in FIGS. 1, 3, 5A, and 5B are first cutout portions 21 and 31, as shown in FIG. 8, second cutout portions 22 and 32 that can be distinguished from the first cutout portions 21 and 31 may be formed at digit positions where the first cutout portions 21 and 31 are not formed, among the digit positions e1 to e9 and f1 to f9. In the example of FIG. 8, the second cutout portions 22 and 32 are notches having a triangular shape in a plan view. In this case, the first cutout portions 21 and 31 indicate "1," and the second cutout portions 22 and 32 indicate "0."

Figure 9:
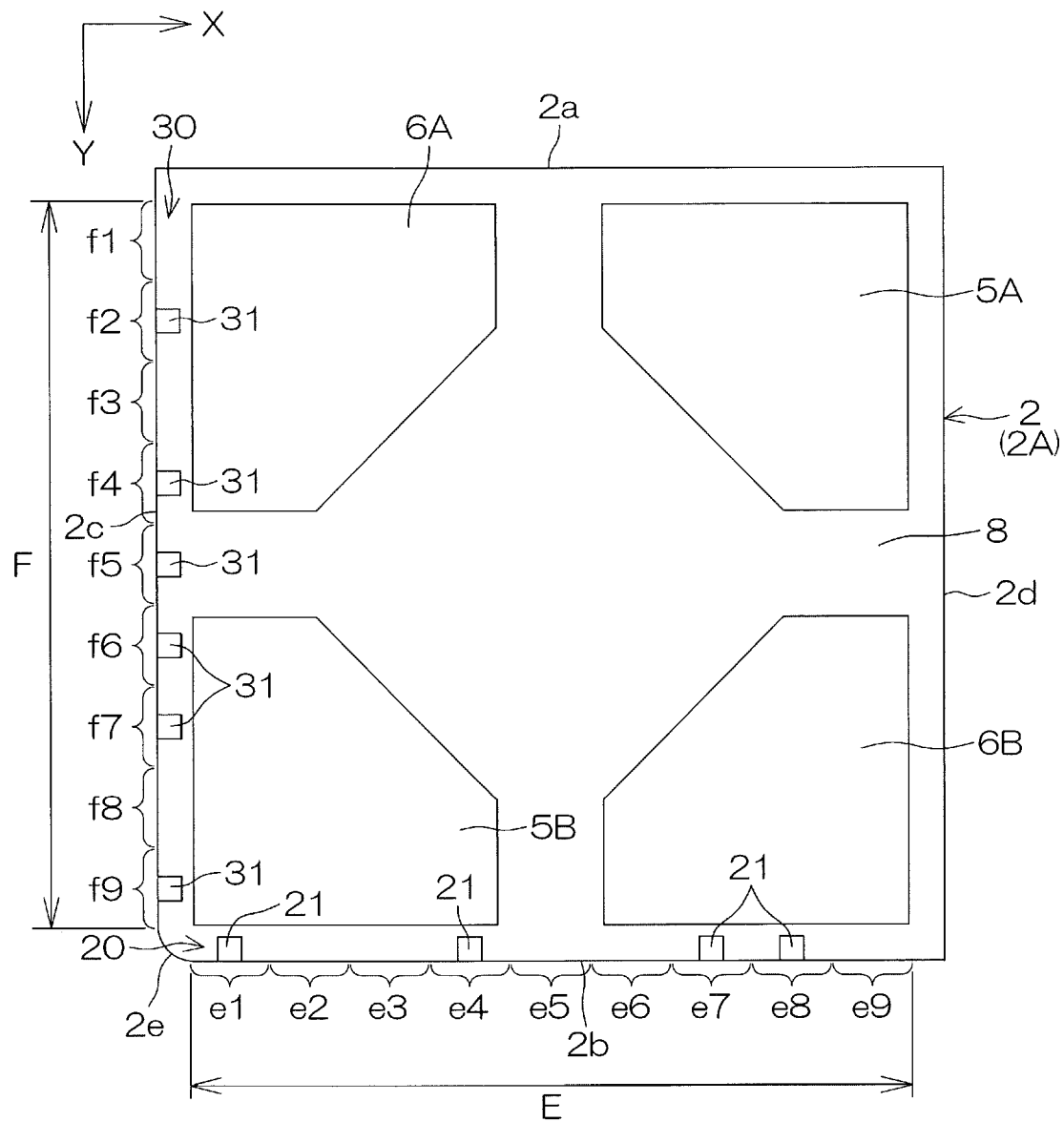
FIG. 9 is a plan view showing another modification of the first pattern and the second pattern.
Figure 10:
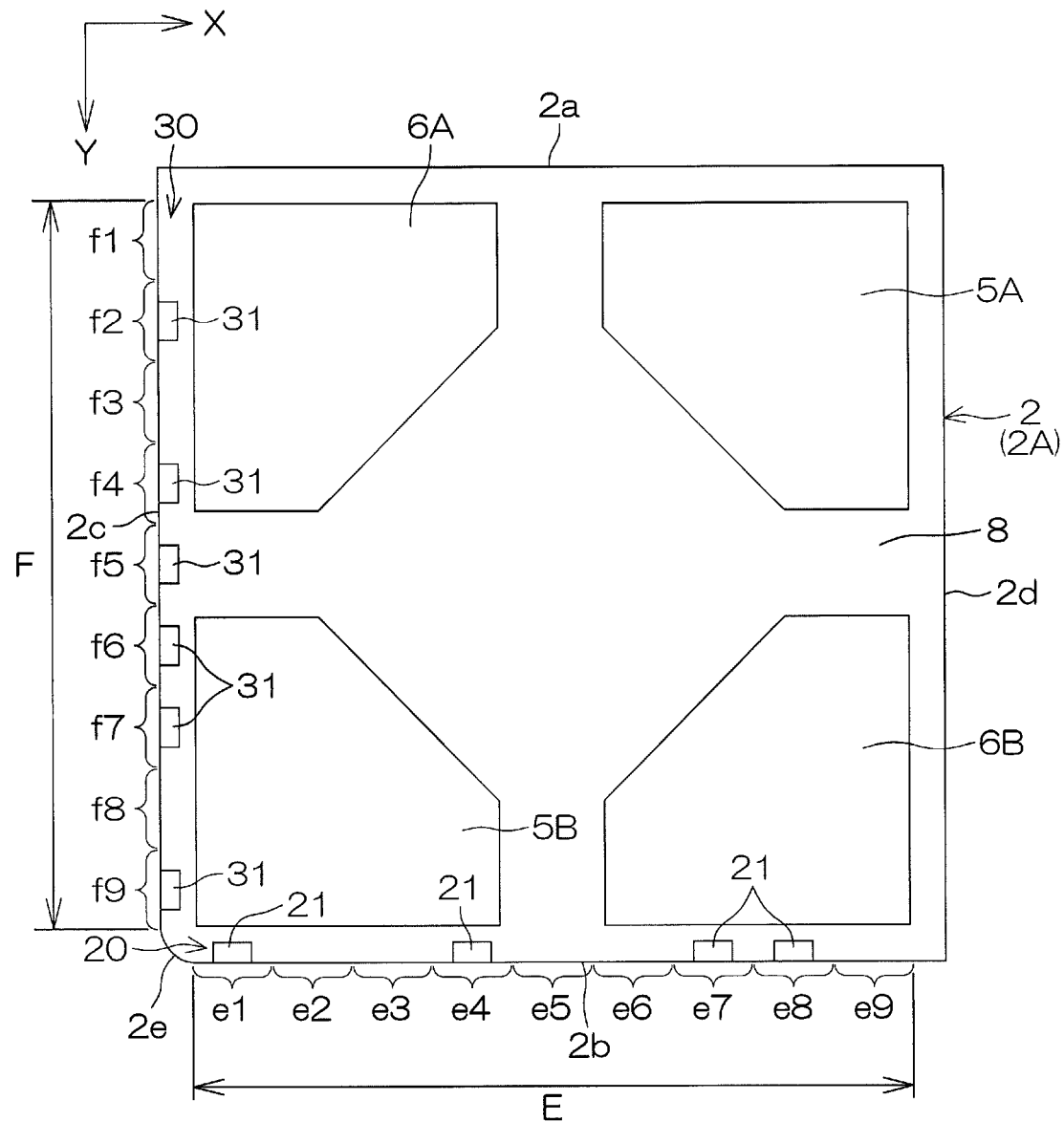
FIG. 10 is a plan view showing still another modification of the first pattern and the second pattern.
Figure 11:
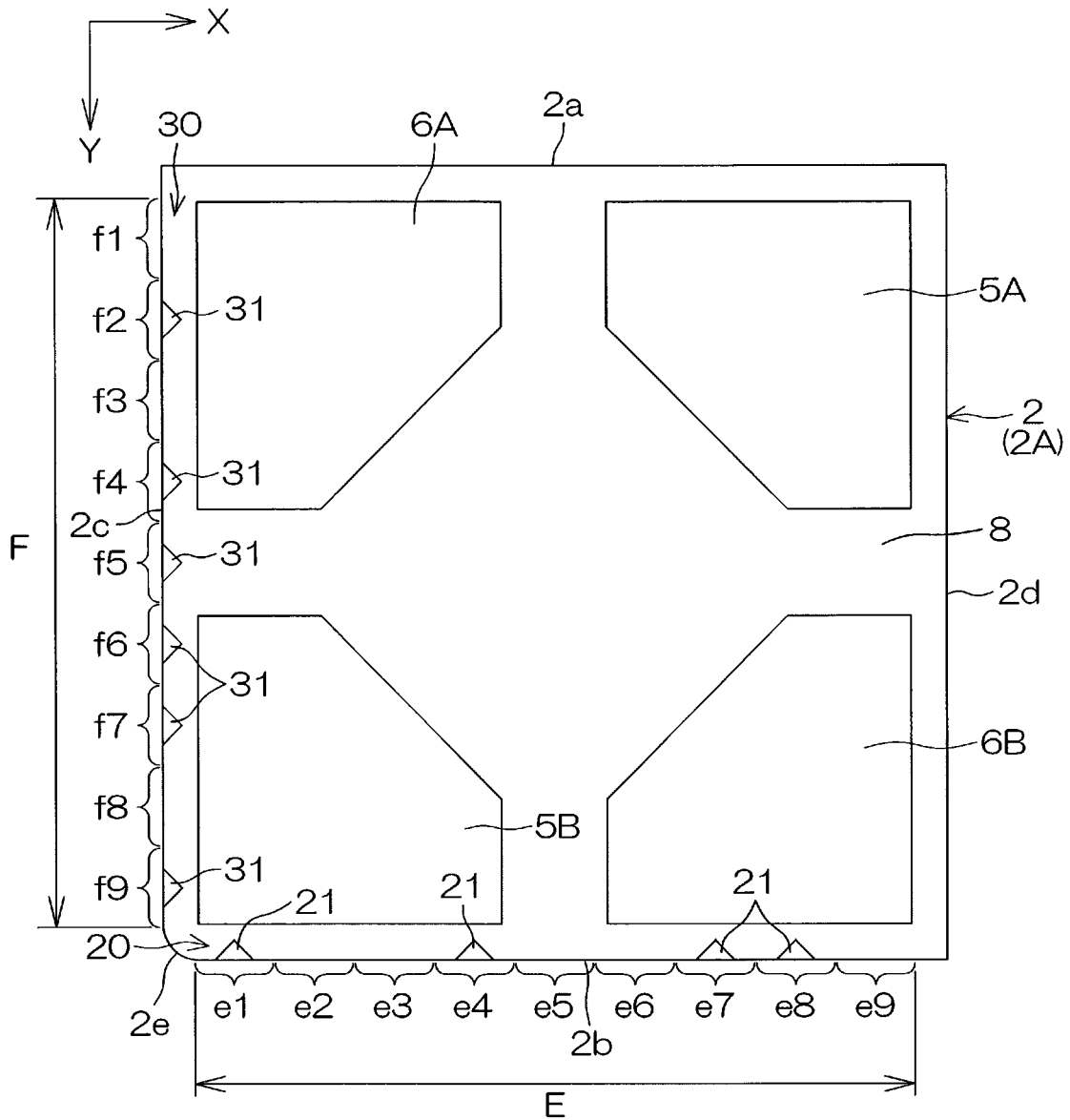
FIG. 11 is a plan view showing still another modification of the first pattern and the second pattern.
Figure 12:
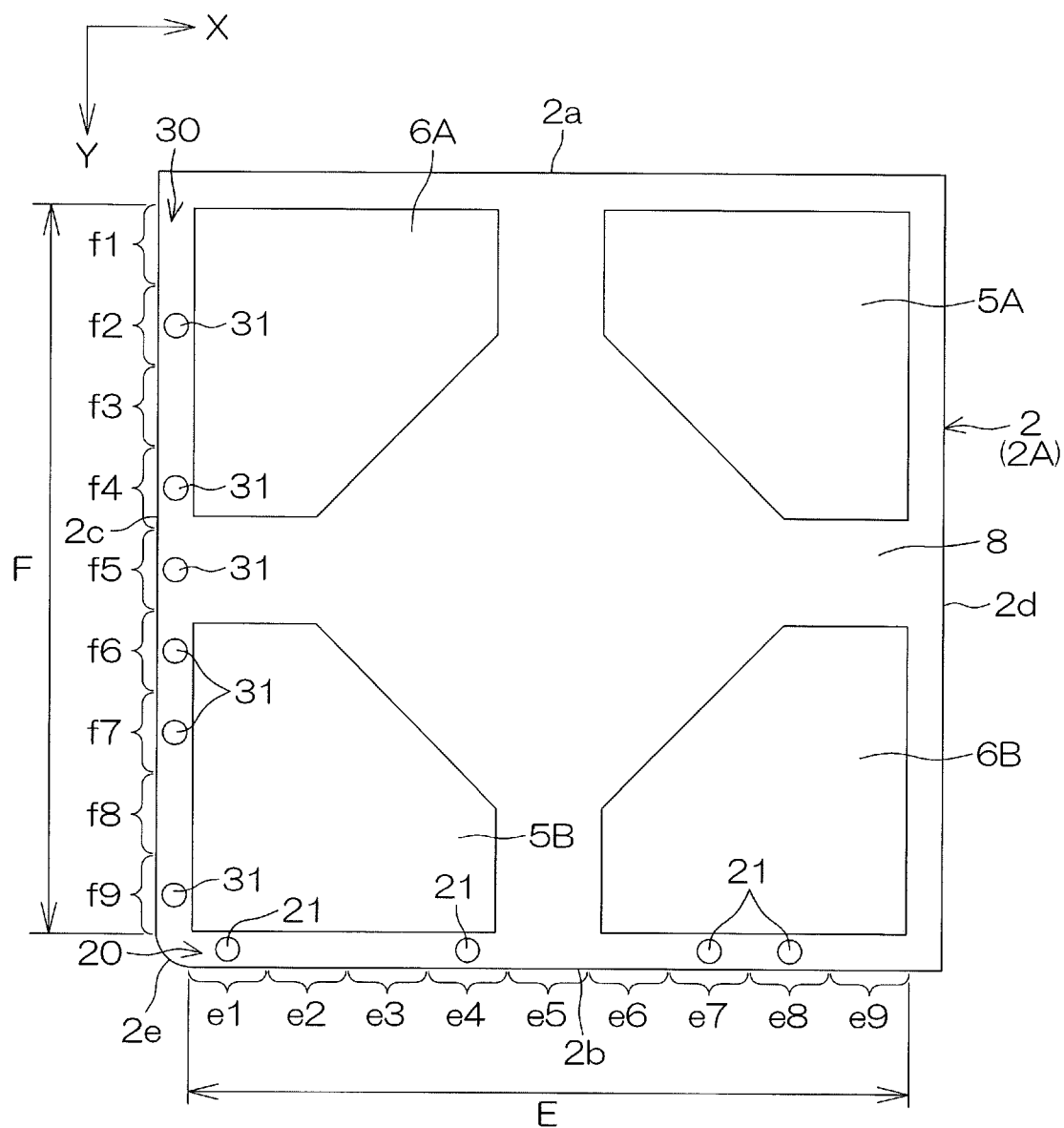
FIG. 12 is a plan view showing still another modification of the first pattern and the second pattern.
Figure 13:
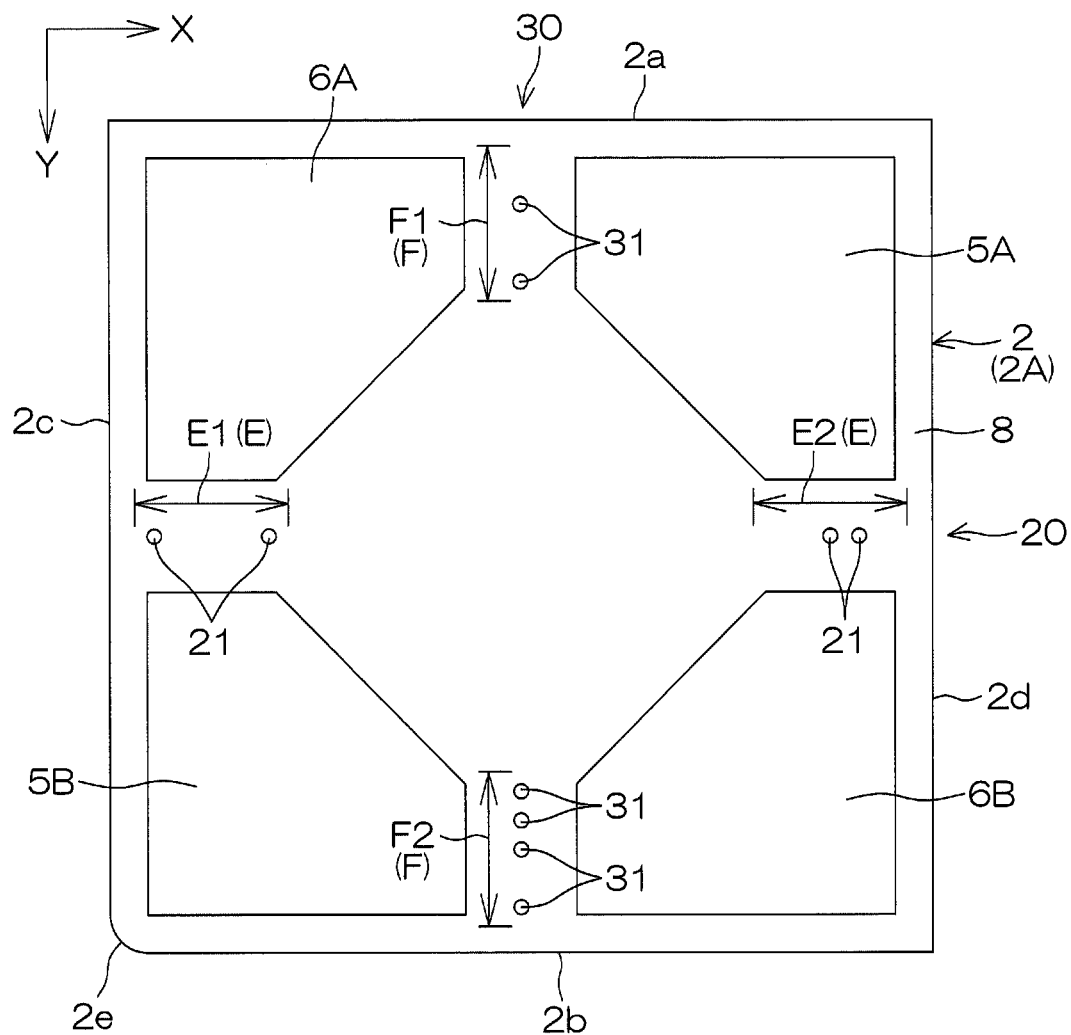
FIG. 13 is a plan view showing still another modification of the first pattern and the second pattern.

As shown in FIG. 9, the cutout portions 21 and 31 may have a square shape in a plan view. Further, as shown in FIG. 10, the cutout portions 21 and 31 may have a rectangular shape in a plan view. Further, as shown in FIG. 11, the cutout portions 21 and 31 may have a triangular shape in a plan view. Further, as shown in FIG. 12, the cutout portions 21 and 31 may have a circular shape in a plan view. As shown in FIG. 13, in the protective film 8, a region consisting of a region E1 in the vicinity of a region between the input terminal 5B and the output terminal 6A and a region E2 in the vicinity of a region between the input terminal 5A and the output terminal 6B may be set as the first region E in which the first pattern 20 is formed. Further, as shown in FIG. 13, in the protective film 8, a region consisting of a region F1 in the vicinity of a region between the input terminal 5A and the output terminal 6A and a region F2 in the vicinity of a region between the input terminal 5B and the output terminal 6B may be set as the second region F in which the second pattern 30 is formed. In the example of FIG. 13, the cutout portions 21 and 31 are configured as circular holes in a plan view. The four regions E1, E2, F1, and F2 in the protective film 8 are examples of "four strip portions" in the present disclosure.

Figure 14G:
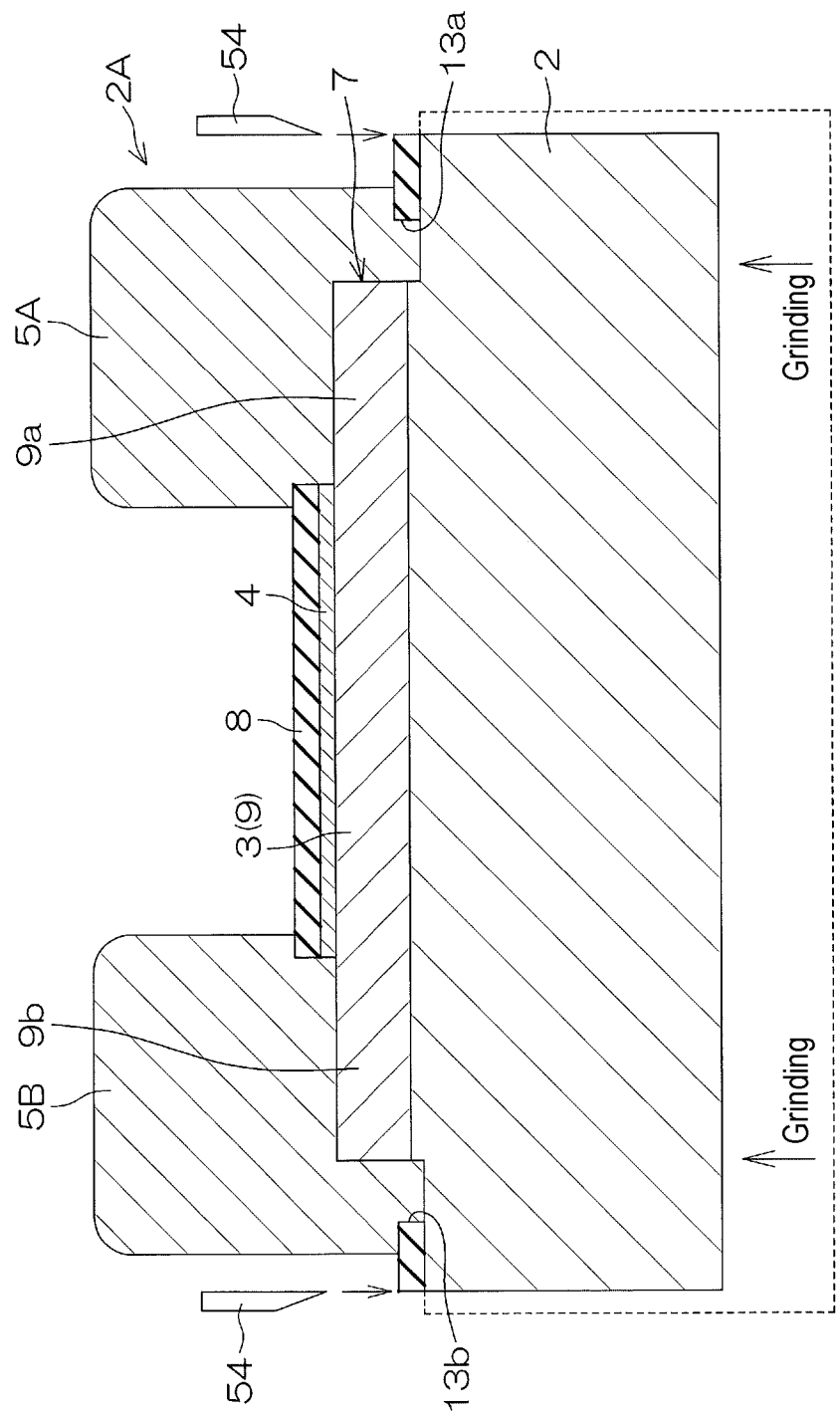
FIG. 14G is a cross-sectional view showing a subsequent process of FIG. 14F.

As described above, according to the present embodiment, the position of the Hall element 1 before separation of the Hall element 1 from the original substrate 50 (the position of the Hall element 1 on the original substrate in the semiconductor element) can be accurately recognized. FIGS. 14A to 14G are cross-sectional views showing processes in a method of manufacturing the Hall element 1 shown in FIG. 1. FIGS. 14A to 14G are cross-sectional views of a portion corresponding to FIG. 2 described above. In manufacturing the Hall element 1, first, as shown in FIG. 14A, the original substrate (semiconductor wafer) 50 containing disk-shaped GaAs, which is an origin of the substrate 2, is prepared. Then, a first compound semiconductor layer 51, which is an origin of the magnetic-sensitive layer 3, is formed by epitaxially growing GaAs while doping with Si as n-type impurities. Subsequently, a second compound semiconductor layer 52, which is an origin of the cap layer 4, is formed by epitaxially growing GaAs without doping impurities.

Subsequently, a resist mask (not shown) formed of, for example, photosensitive polyimide is applied onto the second compound semiconductor layer 52. Subsequently, the resist mask is selectively exposed and developed, so that a resist mask covering a region where the mesa structure 7 is to be formed is formed on the second compound semiconductor layer 52. Then, as shown in FIG. 14B, unnecessary portions of the second compound semiconductor layer 52, the first compound semiconductor layer 51, and the original substrate 50 are removed by etching (for example, reactive ion etching) through the resist mask. As a result, the mesa structure 53 including the cross-shaped magnetic-sensitive layer 3 and second compound semiconductor layer 52 in a plan view is formed. Thereafter, the resist mask is removed.

Subsequently, as shown in FIG. 14C, SiN is deposited by, for example, a CVD method or the like to form the protective film 8 that covers the entire surface. Subsequently, a resist mask (not shown) having openings selectively formed in a region where the pair of input side contact openings 13a and 13b and the pair of output side contact openings 14a and 14b are to be formed is formed on the protective film 8. Then, as shown in FIG. 14D, the protective film 8 is etched by etching through the resist mask. As a result, the pair of input side contact openings 13a and 13b and the pair of output side contact openings 14a and 14b are formed on the protective film 8.

Thereafter, the second compound semiconductor layer 52 exposed to the pair of the input side contact openings 13a and 13b and the pair of output side contact openings 14a and 14b is removed by etching. At this time, the exposed surfaces of the magnetic-sensitive layer 3 and the original substrate 50 are etched by about several hundred angstroms. As a result, the mesa structure 7 including the magnetic-sensitive layer 3 and the cap layer 4 is formed. Then, the resist mask is removed.

Subsequently, as shown in FIG. 14E, the pair of input terminals 5a and 5b and the pair of output terminals 6a and 6b are formed to fill the pair of input side contact openings 13a and 13b and the pair of output side contact openings 14a and 14b, respectively. Subsequently, as shown in FIG. 14F, the protective film 8 at the boundary region 102 (see FIG. 6B) is removed by etching, and at the same time, the cutout portions 21 and 22 are formed. The pattern of the cutout portions 21 and 22 is different for each Hall element region 101. As a result, the patterns 20 and 30 corresponding to the position of the Hall element region 101 on the original substrate 50 are formed for each Hall element region 101.

Finally, as shown in FIG. 14G, the original substrate 50 is thinned by being ground from the back surface side by, for example, a wrapping method, a CMP method, or the like. Thereafter, the original substrate 50 is cut along the boundary region 102 (see FIG. 6B) by a dicing saw 54, so that individual pieces of the Hall element 1 including the substrate 2 and the element constitution part 2A are cut out. As a result, a semiconductor element group composed of a plurality of Hall elements can be obtained. In this way, the Hall element 1 shown in FIGS. 1 to 4 is manufactured.

Although the embodiment in which the present disclosure is applied to a Hall element as an example of a magnetic-electric conversion element has been described above, the present disclosure can be applied to a semiconductor element such as a transistor, a diode, or a semiconductor laser, in addition to magnetic-electric conversion elements other than the Hall element. In the above embodiment, the patterns 20 and 30 are formed on the element constitution part 2A, but the patterns 20 and 30 may be formed on the substrate 2.

In the above embodiment, the patterns 20 and 30 indicate coordinate values by binary numbers, but the patterns 20 and 30 may indicate the coordinate values by n-ary numbers (n is an integer of three or more) other than the binary numbers. In this case, n types of cutout portions 21 and 31 are prepared. For example, when the coordinate values are indicated by a ternary number, three types of shapes (for example, trapezoid, triangle, and square) for indicating "0," "1," and "2," which may be used for one digit of the ternary number, respectively, are prepared as the shapes of the cutout portions 21 and 31.

In addition, various changes in design can be made within the scope of the matters stated in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor element separated from an original substrate, the semiconductor element comprising:
an element substrate; and
an element constitution part formed on the element substrate,
wherein a pattern indicating a position of the semiconductor element before separating the semiconductor element from the original substrate is formed on at least one of the element substrate and the element constitution part,
wherein the pattern includes a first pattern indicating a first coordinate value of the semiconductor element before separating the semiconductor element from the original substrate, and a second pattern indicating a second coordinate value of the semiconductor element before separating the semiconductor element from the original substrate,
wherein the first pattern indicates the first coordinate value of the semiconductor element before separating the semiconductor element from the original substrate by a first binary number,
wherein the second pattern indicates the second coordinate value of the semiconductor element before separating the semiconductor element from the original substrate by a second binary number,
wherein the element constitution part includes a protective film,
wherein the first pattern is configured to indicate the first coordinate value by the first binary number by using presence or absence of a cutout portion at each of a plurality of digit positions set in a first region of the protective film, and
wherein the second pattern is configured to indicate the second coordinate value by the second binary number by using presence or absence of a cutout portion at each of a plurality of digit positions set in a second region, which is different from the first region, of the protective film.

2. The semiconductor element of claim 1, wherein the element substrate has a quadrangular shape in a plan view,
wherein the protective film is formed on at least a peripheral edge portion of one surface of the element substrate, and has a first side and a second side,
wherein the first region is set along the first side, and
wherein the second region is set along the second side.

3. The semiconductor element of claim 1, wherein the element substrate has a quadrangular shape in a plan view,
wherein the protective film includes at least four strip portions extending inward from a central portion of each side of the element substrate in a plan view,
wherein the first region is set in two of the four strip portions extending from the central portion of a pair of sides of the element substrate that face each other in a plan view, and
wherein the second region is set in the remaining two strip portions.

4. The semiconductor element of claim 1, wherein the cutout portions have a trapezoidal shape, a square shape, a rectangular shape, a triangular shape, or a circular shape in a plan view.

5. The semiconductor element of claim 1, wherein the element constitution part is a magnetic-electric conversion element.

6. The semiconductor element of claim 5, wherein the element constitution part includes:
a magnetic-sensitive layer formed on the element substrate; and
a pair of input terminals and a pair of output terminals, which are electrically connected to the magnetic-sensitive layer,
wherein the magnetic-sensitive layer includes an input side region extending in one direction and an output side region extending in a direction intersecting the input side region in a plan view,
wherein the output side region includes a first output side region protruding from one side of the input side region and a second output side region protruding from the other side of the input side region, and
wherein the protective film is formed so as to cover the element substrate and the magnetic-sensitive layer in a plan view, and has a pair of input side contact openings in which parts of the pair of input terminals, respectively, are buried and a pair of output side contact openings in which parts of the pair of output terminals, respectively, are buried.

7. A semiconductor element group separated from a plurality of element regions of an original substrate, the semiconductor element group comprising a plurality of semiconductor elements,
 wherein each of the plurality of semiconductor elements includes:
  an element substrate separated from the original substrate; and
  an element constitution part formed on the element substrate,
 wherein a pattern indicating a position of a corresponding one of the plurality of semiconductor elements before separating the plurality of semiconductor elements from the original substrate is formed on at least one of the element substrate and the element constitution part of the each of the plurality of semiconductor elements,
 wherein the pattern includes a first pattern indicating a first coordinate value of the corresponding one of the plurality of semiconductor elements in the original substrate, and a second pattern indicating a second coordinate value of the corresponding one of the plurality of semiconductor elements in the original substrate,
 wherein the first pattern indicates the first coordinate value of the corresponding one of the plurality of semiconductor elements in the original substrate by a first binary number,
 wherein the second pattern indicates the second coordinate value of the corresponding one of the plurality of semiconductor elements in the original substrate by a second binary number,
 wherein the element constitution part includes a protective film,
 wherein the first pattern is configured to indicate the first coordinate value by the first binary number by using presence or absence of a cutout portion at each of a plurality of digit positions set in a first region of the protective film, and
 wherein the second pattern is configured to indicate the second coordinate value by the second binary number by using presence or absence of a cutout portion at each of a plurality of digit positions set in a second region, which is different from the first region, of the protective film.

8. A method of manufacturing a semiconductor element, comprising:
 forming a plurality of semiconductor elements, each of which includes an element substrate and an element constitution part, on an original substrate by forming the element constitution part in each of a plurality of element regions of the original substrate;
 forming a pattern indicating a position of a corresponding one of the plurality of semiconductor elements in the original substrate on at least one of the element substrate and the element constitution part of each of the plurality of semiconductor elements; and
 obtaining the plurality of semiconductor elements by separating the plurality of element regions of the original substrate,
 wherein the pattern includes a first pattern indicating a first coordinate value of the corresponding one of the plurality of semiconductor elements in the original substrate, and a second pattern indicating a second coordinate value of the corresponding one of the plurality of semiconductor elements in the original substrate,
 wherein the first pattern indicates the first coordinate value of the corresponding one of the plurality of semiconductor elements in the original substrate by a first binary number,
 wherein the second pattern indicates the second coordinate value of the corresponding one of the plurality of semiconductor elements in the original substrate by a second binary number,
 wherein the element constitution part includes a protective film,
 wherein the act of forming the pattern includes forming, for each of the plurality of element regions, the first pattern in a first region of the protective film and the second pattern in a second region, which is different from the first region, of the protective film,
 wherein the first pattern is configured to indicate the first coordinate value by the first binary number by using presence or absence of a cutout portion at each of a plurality of digit positions set in the first region, and
 wherein the second pattern is configured to indicate the second coordinate value by the second binary number by using presence or absence of a cutout portion at each of a plurality of digit positions set in the second region.

9. The method of claim 8, wherein the element constitution part is a magnetic conversion element, and
 wherein the act of forming the plurality of semiconductor elements on the original substrate includes:
  forming a first compound semiconductor layer, which is an origin of a magnetic-sensitive layer, and a second compound semiconductor layer, which is an origin of a cap layer, in this order on the original substrate;
  patterning the first compound semiconductor layer and the second compound semiconductor layer to form the magnetic-sensitive layer and the cap layer disposed on the magnetic-sensitive layer for each of the element regions, the magnetic-sensitive layer having a cross shape in a plan view and having an input side region extending in one direction and an output side region extending in a direction intersecting the input side region;
  forming the protective film;
  forming a pair of input side contact openings exposing both end portions of the input side region and a pair of output side contact openings exposing both end portions of the output side region on the protective film; and
  burying a pair of input terminals in contact with the input side region in the pair of input side contact openings and burying a pair of output terminals in contact with the output side region in the pair of output side contact openings.

* * * * *